(12) United States Patent
Alexander et al.

(10) Patent No.: US 7,626,828 B1
(45) Date of Patent: Dec. 1, 2009

(54) PROVIDING A RESISTIVE ELEMENT BETWEEN REFERENCE PLANE LAYERS IN A CIRCUIT BOARD

(75) Inventors: Arthur R. Alexander, Valley Center, CA (US); Jun Fan, San Marcos, CA (US); James L. Knighten, Poway, CA (US); Norman W. Smith, San Marcos, CA (US)

(73) Assignee: Teradata US, Inc., Miamisburg, OH (US)

( * ) Notice: Subject to any disclaimer, the term of this patent is extended or adjusted under 35 U.S.C. 154(b) by 1097 days.

(21) Appl. No.: 10/630,886

(22) Filed: Jul. 30, 2003

(51) Int. Cl.
*H05K 1/18* (2006.01)

(52) U.S. Cl. .................. 361/763; 361/764; 361/766

(58) Field of Classification Search ... 361/306.2–306.3, 361/764–766, 782–795; 174/260–266; 428/209–210
See application file for complete search history.

(56) References Cited

U.S. PATENT DOCUMENTS

| | | | | |
|---|---|---|---|---|
| 3,749,971 A * | 7/1973 | Petty | ............................. | 345/66 |
| 4,436,953 A * | 3/1984 | Gottlieb | ..................... | 174/72 B |
| 4,720,766 A * | 1/1988 | Honda | ..................... | 361/275.3 |
| 4,777,718 A * | 10/1988 | Henderson et al. | ............. | 29/620 |
| 5,027,253 A | 6/1991 | Lauffer et al. | ................ | 361/321 |
| 5,261,153 A | 11/1993 | Lucas | ........................... | 29/830 |
| 5,652,562 A * | 7/1997 | Riley | ........................... | 337/405 |
| 5,757,076 A * | 5/1998 | Kambara | ..................... | 257/724 |
| 5,796,587 A | 8/1998 | Lauffer et al. | ................ | 361/763 |
| 5,953,203 A | 9/1999 | Tormey et al. | ............... | 361/313 |
| 6,043,973 A * | 3/2000 | Nagashima et al. | .......... | 361/305 |
| 6,068,782 A | 5/2000 | Brandt et al. | ................... | 216/17 |
| 6,153,290 A * | 11/2000 | Sunahara | ..................... | 428/210 |
| 6,198,362 B1 | 3/2001 | Harada et al. | .................. | 333/12 |
| 6,215,372 B1 * | 4/2001 | Novak | ........................... | 333/12 |
| 6,256,850 B1 | 7/2001 | Lauffer et al. | ............... | 29/25.42 |
| 6,329,590 B1 | 12/2001 | Alexander et al. | ............. | 174/35 |
| 6,407,929 B1 | 6/2002 | Hale et al. | .................... | 361/763 |
| 6,611,419 B1 * | 8/2003 | Chakravorty | .............. | 361/306.3 |
| 6,737,749 B2 * | 5/2004 | Tomsio et al. | ................ | 257/774 |

OTHER PUBLICATIONS

Precision Resistor Networks, Resistors Advanced Information, Honeywell.*
Configurating a Discrete Resistor Verification Test System, Keithly Instrument Inc.*
U.S. Appl. No. 10/287,116, filed Nov. 4, 2002, Jun Fan et al.
U.S. Appl. No. 10/670,829, filed Nov. 4, 2002, Jun Fan et al.
Chip Scale Review, "Embedded Capacitors Improve Overall Device Performance," pp. 1-2, printed from website http://www.chipscalereview.com/isues/0802/patents.html (Aug.-Sep. 2002).

* cited by examiner

*Primary Examiner*—Tuan T Dinh
(74) *Attorney, Agent, or Firm*—Trop, Pruner & Hu; Harden E. Stevens

(57) ABSTRACT

A circuit board includes reference plane layers and a dielectric between the reference plane layers. A resistive element is also provided between the reference plane layers to provide a resistive path between the reference plane layers. Optimally, a decoupling capacitor is provided having a first electrode electrically connected to the resistive element, and a second electrode electrically connected to one of the reference plane layers.

2 Claims, 7 Drawing Sheets

PROVIDING A RESISTIVE ELEMENT BETWEEN REFERENCE PLANE LAYERS IN A CIRCUIT BOARD

BACKGROUND

A circuit board (sometimes referred to as a printed circuit board or a printed wiring board) is the basic building block for interconnecting electronic devices in a system. Electronic devices, usually integrated circuit (IC) devices, are mounted onto the circuit boards using a number of mounting mechanisms, such as by use of connectors or by directly mounting the devices onto a surface of the circuit board. A circuit board also includes the wiring required to interconnect the devices electrically, and the circuit board provides the primary support for the devices.

The density of signal lines in a circuit board is continuously increasing due to the increased density of circuits that can be formed on each IC chip. The number of input/output (I/O) pins that exist on each IC chip can be quite large, which means that a large number of signal wires are needed to carry signals from one IC chip to another component in the system. To increase the density of signal wires that can be provided in the circuit board, a circuit board is usually formed of multiple layers. Some layers contain signal wires for transmitting signals, while other layers contain power and ground reference planes, which are connected to ground or to a power supply voltage, e.g., a three-volt voltage, a five-volt voltage, or some other power supply voltage. In other arrangements of circuit boards, power reference planes are not used. To connect signal wires in different layers of the circuit board, vias are provided. A via is an electrical connection that is run through multiple layers of the circuit board to complete a signal path using different layers, or to provide an electrical connection to ground or power. Typically, the via is run generally perpendicularly to a main surface of the circuit board.

With large numbers of IC chips and signal wires in a circuit board, switching noise can be a problem during system operation, especially at high frequencies. To mitigate switching noise, surface mount technology (SMT) decoupling capacitors are commonly used. These capacitors are mounted to either the primary or secondary (top or bottom) surface of the circuit board, and connected to reference planes through vias. At high frequencies, a capacitor provides a low impedance bypass path for switching noise between a power supply voltage plane and a ground plane.

One issue associated with connecting decoupling capacitors to reference planes is the relatively high inductance resulting from the combination of the capacitor's package, vias, and the interconnecting structure from the decoupling capacitor to the vias. As frequencies increase into the hundreds of megahertz (MHz) or gigahertz (GHz) range, the impedance associated with the combined inductance of each decoupling capacitor circuit becomes much larger than the capacitive impedance associated with the decoupling capacitor itself. To reduce the package inductance, SMT capacitors are used. To reduce the interconnection inductance, low-inductance interconnections are used, such as short wires, short via holes, wide interconnects, multiple vias, and so forth. Nevertheless, because of the increased impedance caused by the inductance of the via between the decoupling capacitor and the reference plane, the capacitor may not be able to effectively provide a low-impedance bypass path for switching noise at high frequencies. In other words, because of a significant impedance introduced by the via inductance into the decoupling path, a capacitor loses its decoupling effectiveness in providing a bypass path for high frequency noise.

Another issue associated with circuit boards is radiated electromagnetic interference (EMI), which increases as signal density and switching speeds increase. EMI is a byproduct of noise currents generated by the switching of active devices in the circuit board. When noise currents reach the DC power bus (which includes power and ground reference planes) of the circuit board, noise voltages can be generated in the power bus that are proportional to the impedance of the power bus. The noise voltages can propagate throughout the power bus and radiate by various mechanisms.

In a circuit board in which active devices are switching at high rates (such as in the gigahertz range), or switching with rapid transitions (such as more rapid than a nanosecond), the noise currents generated in the power bus have more high-frequency spectral components, which may require the DC power bus of the circuit board to have a very low impedance to avoid problems at the high frequencies that are possibly in the spectrum of the noise currents. Decoupling capacitors are typically used to control the power bus impedance. However, as noted above, the effectiveness of conventional decoupling capacitors in maintaining a low power bus impedance is limited by frequency, since the parasitics of these capacitors may make them ineffective at frequencies of several hundred megahertz and above. As a result, the circuit board first resonates at a frequency determined by the parasitic inductance of the decoupling capacitors (referred to as lumped resonance) resulting in a peak in the impedance of the circuit board. At higher frequencies, the circuit board has distributed resonances, which are related to the physical dimensions of the circuit board.

SUMMARY

In general, methods and apparatus are provided to improve high-speed performance of a circuit board. For example, a circuit board includes first and second reference plane layers and a dielectric layer between the first and second reference plane layers. A resistive element is provided between the first and second reference plane layers.

Other or alternative features will become more apparent from the following description, from the drawings, and from the claims.

DETAILED DESCRIPTION

In the following description, numerous details are set forth to provide an understanding of the present invention. However, it will be understood by those skilled in the art that the present invention may be practiced without these details and that numerous variations or modifications from the described embodiments are possible.

Figure 1:
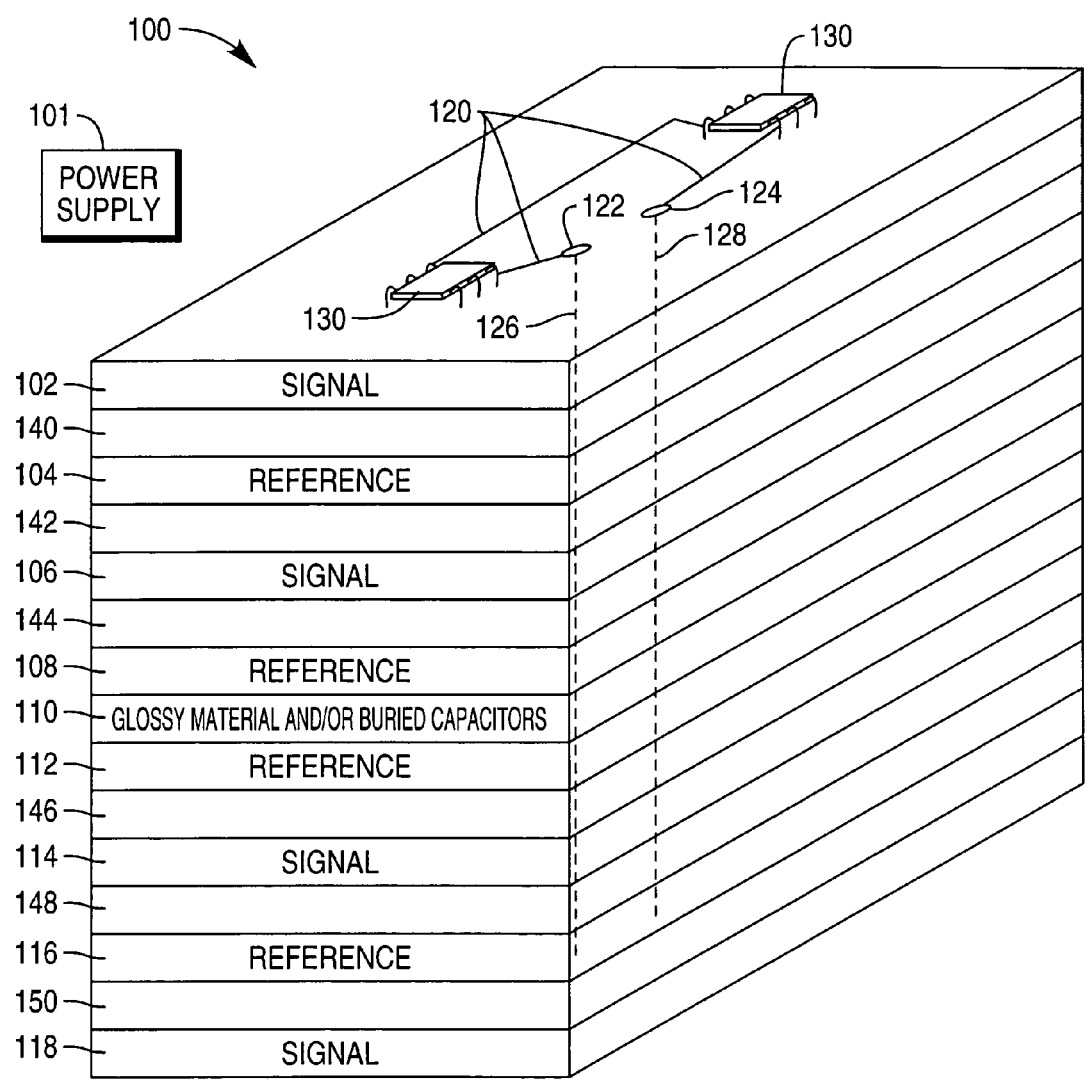
FIG. 1 illustrates an example arrangement of a circuit board that includes resistive elements and/or buried decoupling capacitors between reference plane layers.

As shown in FIG. 1, an example circuit board 100 includes multiple layers 102, 104, 106, 108, 112, 114, 116, and 118. In other embodiments, a larger or smaller number of layers can be used in the circuit board. As used here, a "circuit board" refers to any structure containing signal wires or conductors (for routing signals) and containing reference planes (to carry ground and power supply voltages). Examples of circuit boards include printed wiring boards (PWBs), sometimes referred to as printed circuit boards (PCBs). A circuit board also covers any package, such as an integrated circuit (IC) package, that has multiple layers of signal wires or conductors and power or ground reference planes. The circuit board 100 is part of a system that includes various components, such as a hard disk drive, a display, a central processing unit (CPU), a power supply 101, and so forth. The components (e.g., devices 130) are mounted on one surface (or both a top and bottom surface) of the circuit board 100.

In the example shown in FIG. 1, the layers 102, 106, 114, and 118 are signal layers for carrying signal wires, while the layers 104, 108, 112, and 116 are reference plane layers that contain either a ground plane or a power supply voltage plane connected to a power supply voltage, (e.g., 3 volts, 5 volts, 12 volts, etc.) produced by the power supply 101. Dielectric layers 140, 142, 144, 110, 146, 148, and 150 are provided between successive signal and/or reference plane layers. The dielectric layers are insulator layers to isolate electrical conductors in the circuit board.

In addition, in the region between reference plane layers 108 and 112, embedded lossy resistive element(s) and/or decoupling capacitors (shown in other figures) are provided. The embedded decoupling capacitors provide a low inductance bypass path for switching noise between a power supply voltage plane and ground plane. Thus, in the example of FIG. 1, one of the reference layers 108 and 112 is a ground reference layer, while the other one of the reference layers 108 and 112 is a power supply voltage reference layer. If decoupling capacitors are embedded in the region between reference plane layers 108 and 112, each of the decoupling capacitors has electrodes that are electrically connected to the power and ground reference layers 108 and 112. The embedded resistive element(s) are provided to reduce the Quality Factor (Q) of resonances in the power bus impedance at high frequencies such that electromagnetic interference (EMI) radiations are reduced and the performance of the decoupling capacitors are enhanced.

Although only one dielectric layer 110 associated with embedded lossy resistive element(s) and/or decoupling capacitor(s) is shown in FIG. 1, other embodiments may utilize additional such layers associated with embedded lossy resistive element(s) and/or decoupling capacitor(s).

As further shown in FIG. 1, devices 130 are mounted on a planar surface of the circuit board 100. Signal traces 120 in the layer 102 route signals from the devices 130 to other points on the circuit board 100. Some of the signal traces 120 connect input/output (I/O) pins of the devices 130 to via pads 122 and 124. The via pads 122 and 124 are in turn connected to vias 126 and 128, respectively, which are passed generally vertically through the multiple layers of the circuit board 100.

Figure 2A:
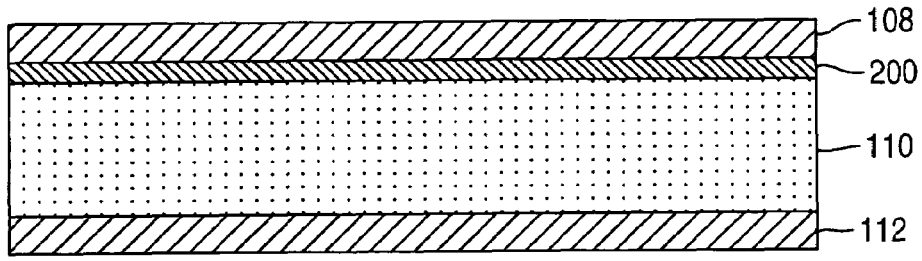
FIGS. 2A-2C are cross-sectional side views of portions of circuit boards according to several embodiments that include reference plane layers and lossy resistive layer(s) between the reference plane layers.

FIG. 2A is a cross-sectional view of one embodiment of a portion of the circuit board 100 that includes reference plane layers 108 and 112 and dielectric layer 110. In addition, a layer 200 formed of a lossy resistive material is embedded between a surface of the dielectric layer 110 and a surface of the reference plane layer 108. In one example implementation, the reference plane layers 108 and 112 are formed of an electrically conductive material such as copper. The dielectric layer 110 is formed of an insulating material, such as a fiber glass material combined with an epoxy-resin (FR-4), or any other suitable dielectric material. The resistive layer 200 is formed of a resistive material, such as any thin or thick-film material that exhibits resistive properties. One example of a thin-film resistive material is thin-film nickel alloy deposited onto copper. An example of a thick-film resistive material is polymer thick-film (PTF) printed resistor.

The combination of the reference plane layers 108 and 112 and the dielectric layer 110 forms a power bus. The surface area of the power bus, the thickness of the resistive layer 200, and the resistivity of the material that forms the resistive layer 200 determine the value of the resistance of the power bus. In the specific embodiment of FIG. 2A, the resistive layer 200 is embedded between the dielectric layer 110 and the upper reference plane layer 108.

Figure 2B:
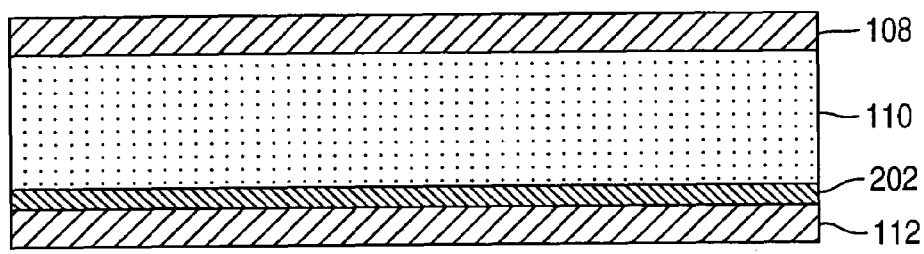
Figure 2C:
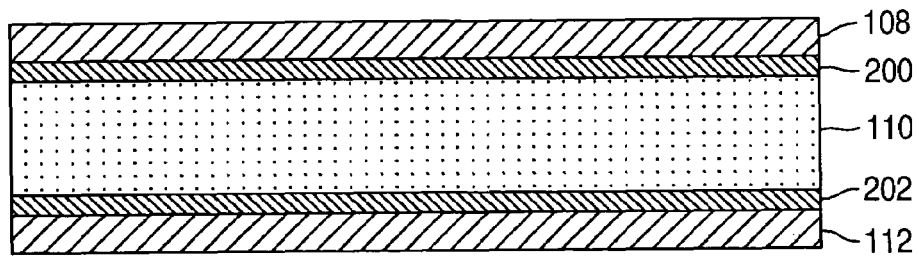

In an alternative embodiment, shown in FIG. 2B, a resistive layer 202 is embedded between the dielectric layer 110 and the lower reference plane layer 112. In yet another arrangement, as shown in FIG. 2C, two resistive layers 200 and 202 are provided, one between the dielectric layer 110 and the upper reference plane layer 108, and the other resistive layer between the dielectric layer 110 and the lower reference plane layer 112.

The introduction of the resistive layer (200 and/or 202) between the reference plane layers adds a resistive load to the currents flowing on the power bus reference planes, which effectively reduces the Q values at the distributed resonances of the circuit board. Thus, during circuit board operations at high frequencies, the peaks and valleys of the power bus impedance are evened out, which reduces the potential of radiated emissions at these resonant frequencies and enhances signal integrity.

As noted above, power bus resonances include lumped resonances and distributed resonances. A lumped resonance is caused by the parasitic inductance of decoupling capacitors. The parasitic inductance is composed of components due to (a) the capacitor package, (b) the mounting pads for the capacitor on the circuit board, (c) vias that connect to power and ground sides of the power bus, and (d) any traces between pad and via.

The distributed resonances are solely a function of board geometrical dimensions, and not a function of any lumped circuit elements (such as decoupling capacitors and so forth). The circuit board basically is a resonant structure at high frequencies. Electromagnetic waves bounce back from edges of the reference planes. At certain discrete frequencies that are related to board dimensions, the wave resonates (purely standing wave between the edges), resulting in high impedance of a power bus. The peak magnitudes of both the lumped and distributed resonances are determined by their corresponding Q factors, which are ratios of the energy stored to the energy consumed at the corresponding resonant frequencies. The lower the Q factor, the lower the board impedance is at these resonant frequencies, and the lower the noise voltage that is generated in the power bus.

By adding a resistive layer (200 and/or 202) between the power and ground planes, the Q factor is lowered and thus more losses demonstrated at each board distributed resonance. When the Q factor is lower, peak magnitudes are damped. As further described in other embodiments, instead of a resistive layer such as 200 or 202, series resistors can be connected to decoupling capacitors (shown in FIGS. 3, 5-7, 9, and 10) to lower lumped resonances.

The assembly of layers shown in FIG. 2A, 2B, or 2C make up a core of a circuit board. During fabrication, the resistive layer is deposited onto an electronically conductive foil (e.g., copper foil), such as by using Ohmega-Ply® technology, as an example. As a result, existing manufacturing processes can be extended to manufacture the core shown in FIG. 2A, 2B, or 2C. With PTF (thick-film resistive material), the core can also be laminated by conventional mechanisms, except that before placing an electrically conductive foil onto the dielectric layer, a resistive film is first added to the dielectric layer or to the electrically conductive foil. The lossy resistive material may have any value of resistivity, but values from a few ohms/square to a few hundred ohms/square (e.g., 2 ohms/square to 900 ohms/square) of surface resistivity are used in some embodiments of the invention. Example specific values of the resistive layer 200 or 202 are 25 ohms/square to 50 ohms/square.

Figure 3:
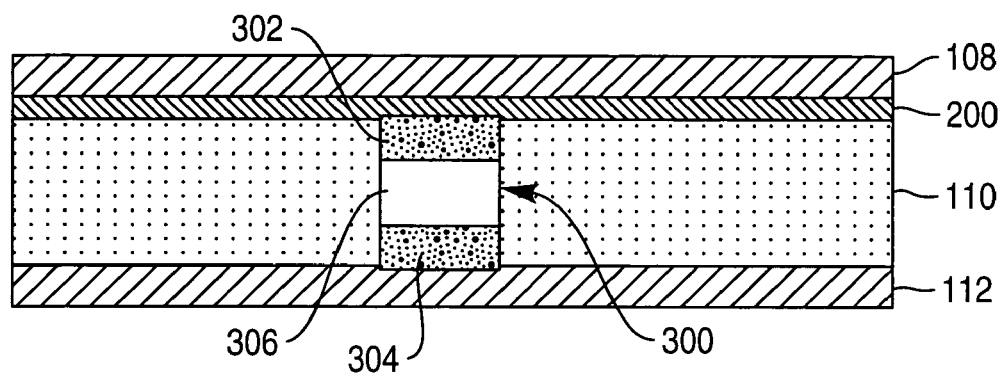
FIG. 3 is a cross-sectional side view of a portion of a circuit board according to another embodiment that includes reference plane layers and resistive layer(s) and decoupling capacitor(s) between the reference plane layers.

According to yet another embodiment, shown in FIG. 3, a decoupling capacitor 300 is provided in the core that also includes reference plane layers 108 and 112, dielectric layer 110, and resistive layer 200. The decoupling capacitor 300 has electrodes 302 and 304 that are separated by a dielectric material 306. The electrode 302 is electrically contacted to the resistive layer 200, while the electrode 304 is electrically contacted to the lower reference plane layer 112.

In one embodiment, the type of decoupling capacitor 300 used is a discrete surface mount technology (SMT) capacitor. As used here, SMT refers to the type of capacitor used, not to the mounting mechanism of the capacitor. In fact, the SMT capacitor 300 shown in FIG. 3 is buried within an inner layer of the circuit board and not mounted to an external surface of the circuit board. A benefit of using SMT capacitors is that they can be "off-the-shelf" discrete IC components that are easily available. Each of such off-the-shelf capacitors has an outer package or protective housing to surround the capacitor components. Electrodes protrude from the package to enable connection of each discrete capacitor to other components. In other embodiments, other types of discrete capacitors are used (e.g., round or circular capacitors). The term "discrete capacitors" generally refers to capacitors that have separate electrodes and dielectric layers—in other words, two capacitors are discrete if they do not share any of their electrodes and dielectric layer with another capacitor.

Although only one decoupling capacitor 300 is shown in FIG. 3, additional decoupling capacitors can be provided between the reference plane layers 108 and 112, with one electrode of each such additional decoupling capacitors electrically contacted to the resistive layer 200 and the other electrode electrically contacted to the lower reference plane layer 112.

In the arrangement shown in FIG. 3, the electrical contact between the capacitor 300 and the resistive layer 200 forms a resistor that is in series, electrically, with the capacitor 300. The value of this resistor is determined by the current flow between the capacitor 300 and the reference plane 108, and is not predetermined by shaping of the resistive layer, such as into patches. The value of this resistor is determined by the "incidental" contact of the capacitor 300 and the resistive layer 200. Electrical contact between the capacitor 300 and the resistive layer 200 may be accomplished by any means, such as by use of a conductive epoxy (between the capacitor electrode 302 and the resistive layer 200) or compression force. Electrical contact between the other capacitor electrode 304 and the reference plane layer 112 can be accomplished by such means as solder, conductive epoxy, or compression force.

A circuit board core that includes the components shown in FIG. 3 can be formed by preparing a template 310 (FIG. 4) of dielectric material with prepared holes 312 suitable to allow insertion of decoupling capacitors 300. In one implementation, the process of building up the core involves soldering the decoupling capacitors 300 to the lower reference plane 112 (without an intermediate resistive material), followed by placing the template 310 over the array of capacitors and applying the reference plane 108 on which the resistive layer 200 is attached.

Figure 4:
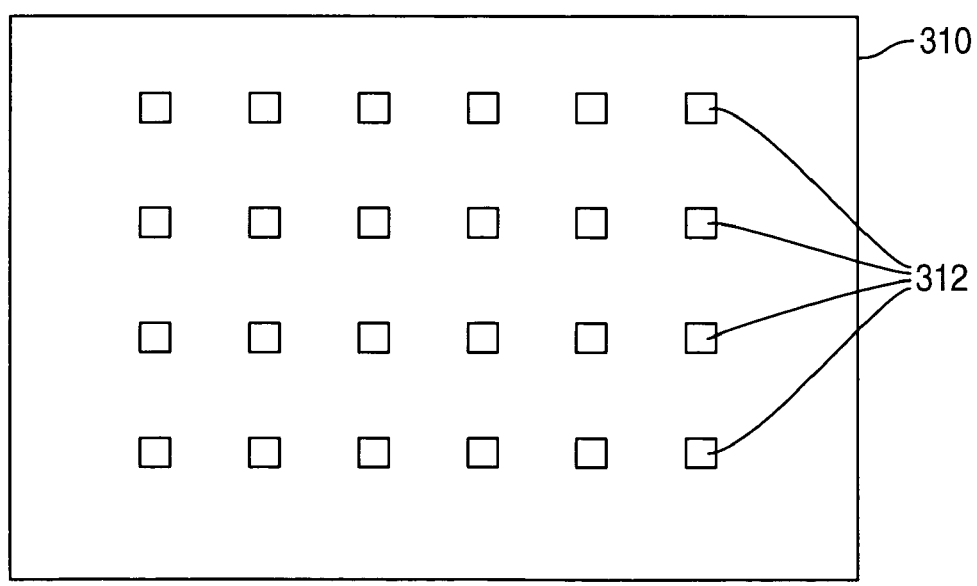
FIG. 4 is a top view of a template of dielectric material to allow insertion of decoupling capacitors into the circuit board according to FIG. 3.

A benefit of using the template 310 shown in FIG. 4 is that the circuit board core of FIG. 3 (with embedded capacitors) requires fewer process steps than other fabrication methods. Another benefit of using the template 310 is that stress from compression forces during and after board manufacture is relieved at the location of the capacitors 300.

In a different embodiment, the resistive layer 200 is provided between the lower capacitor electrode 304 of the capacitor 300 and the lower reference plane layer 112. In yet another embodiment, two resistive layers are provided, one between the capacitor electrode 302 and the upper reference plane layer 108, and one between the capacitor electrode 304 and the lower reference plane layer 112.

Figure 5:
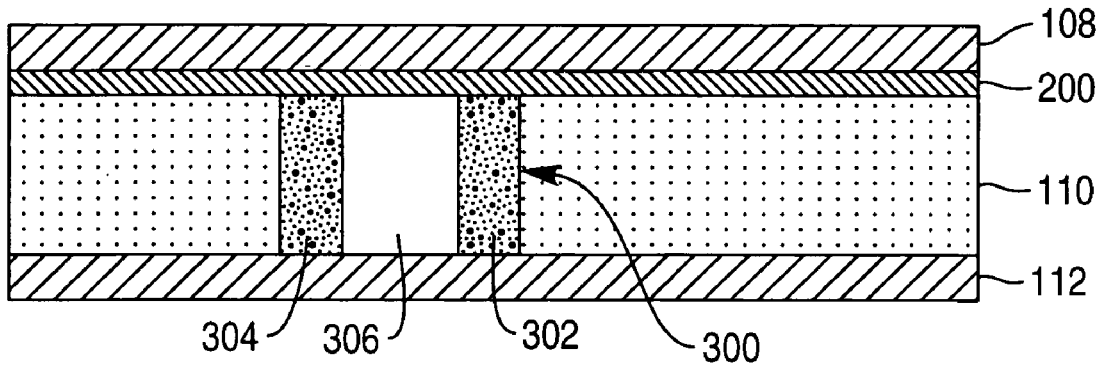
FIG. 5 is a cross-sectional side view of a portion of a circuit board according to a further embodiment that includes reference plane layers and resistive layer(s) and decoupling capacitor(s) between the reference plane layers.

FIG. 5 shows another embodiment of a core that includes one or more decoupling capacitors 300, reference plane layers 108 and 112, and a resistive layer 200. Unlike the embodiment of FIG. 3, the decoupling capacitor 300 of FIG. 5 is rotated so that it is placed on its side. Generally, an SMT decoupling capacitor is shaped as a parallelepiped with conductive ends on two opposing parallel faces. By placing the decoupling capacitor on its side as shown in FIG. 3, the electrodes 302 and 304 are positioned such that the side surfaces of the electrodes are generally parallel to the main surfaces of the reference plane layers and the dielectric layer. The main surfaces of the electrodes, on the other hand, are arranged generally perpendicularly to the main surfaces of the reference plane layers and the dielectric layer. The "main surface" of a component, such as a reference plane layer, a dielectric layer, and a capacitor electrode, refers to a surface of the component that has a larger dimension than another surface of the component.

Figure 6:
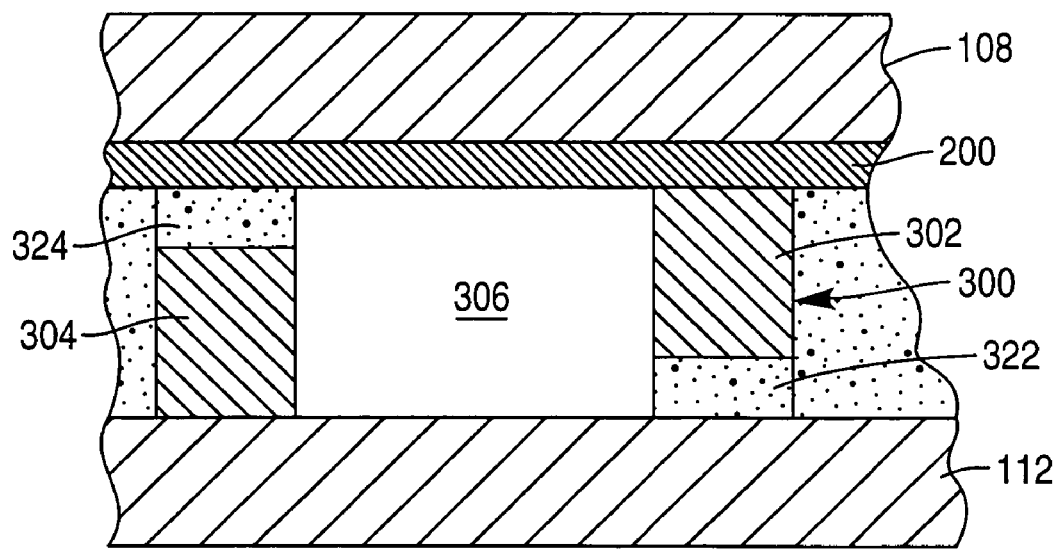
FIG. 6 is a more enlarged cross-sectional view of a portion of the circuit board of FIG. 5.

Some SMT capacitors are constructed so that the distance between the conductive faces (electrodes 302 and 304), the length, is greater than the height of the capacitors. In this case, by placing the capacitor 300 on its side, the distance between the reference planes 108 and 112 is determined by the height of the capacitor 300 (instead of its length) so that a reduced spacing between the reference plane layers 108 and 112 can be achieved. Note that if the SMT decoupling capacitor 300 has a height that is greater than its length, then the alternative vertical arrangement of FIG. 3 may provide smaller spacing between the reference plane layers 108 and 112. Reduced spacing between reference plane layer means a larger capacitance between the reference plane layers to achieve increased noise decoupling. A larger view of the contact between the capacitor 300 and its adjacent layers is shown in FIG. 6. An insulating element 324 formed of an insulating material is provided between the electrode 304 and the resistive layer 200, while an insulating element 322 is provided between the capacitor electrode 302 and the reference plane layer 112. The insulating element 324 provides electrical isolation between the electrode 304 and the resistive layer 200, while the insulating element 322 provides electrical isolation between the electrode 302 and the reference plane layer 112.

In one implementation, the insulating elements 324 and 322 are formed as part of the capacitor 300. In alternative implementations, the insulating elements are formed after the capacitor 300 has been manufactured. The insulating material may be deposited by using a mask or applying a liquid (such as varnish, paint, or another liquid) to an appropriate surface of the capacitor or reference plane layer.

In another embodiment, an additional resistive layer can be added between the capacitor 300 and the lower reference plane layer 112. Alternatively, the upper resistive layer 200 can be omitted while the lower resistive layer is provided between the capacitor 300 and the lower reference plane layer 112.

Figure 7:
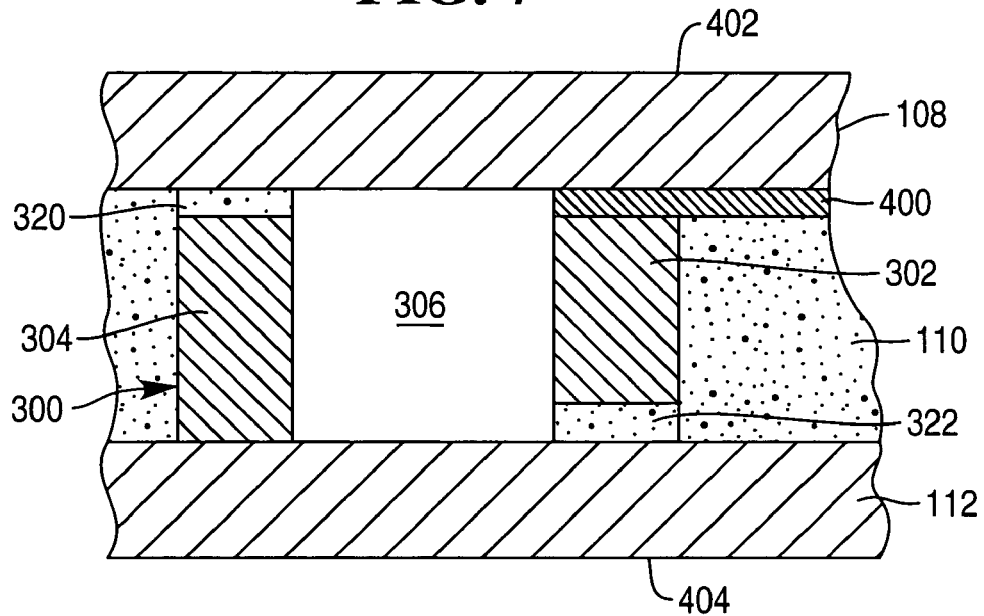
FIG. 7 is a cross-sectional view of a portion of a circuit board of yet a further embodiment that includes reference plane layers and decoupling capacitor(s) and resistive element(s) between the reference plane layers.

In yet another embodiment, shown in FIG. 7, instead of using a resistive layer that extends substantially along the contact surface of the reference plane layer, a more discrete lossy resistive element 400 is provided that is electrically contacted to the electrode 302 of the capacitor 300. FIG. 7 shows the capacitor 300 lying on its side. Also, as with the embodiment of FIG. 6, electrically insulating materials 320 and 322 are used to electrically isolate electrodes 304 and 302, respectively, from reference plane layers 108 and 112. The difference between the FIG. 7 embodiment and the FIG. 6 embodiment is that the resistive loss element 400 does not extend substantially across the contact surface of the reference plane layer 108, but instead is a discrete (or discrete resistor) element that provides a resistive path between the capacitor electrode 302 and the reference plane 108. The resistive element 400 provides a resistor in series with the decoupling capacitor 300 to provide damping of high-frequency resonances on the DC power bus.

The resistive element 400 can be formed of either a thin-film material (such as thin-film nickel or nickel-phosphorous alloy deposited onto copper) or a thick-film resistive material (e.g., polymer thick-film printed resistor). The value of the resistance of the resistive element 400 is determined by the shape and area of the patch of resistive material. Resistance of between about 1 to 10 ohms is anticipated to be adequate to provide damping of lumped element high-frequency oscillations in the power bus. The connections between the capacitor and the resistive element may be by a conductive material, such as conductive epoxy or by intimate contact alone.

An example process of fabricating the core that includes the assembly of FIG. 7 is as follows. The build up of the core starts by placing the decoupling capacitors 300 onto a conductive face of an electrically conductive foil (that makes up lower reference plane layer 112). Several methods of fixing the position and/or assuring a good conductive path can be used, such as solder reflow or conductive epoxy. The second electronically conductive foil (that makes up reference plane layer 108) for this core contains the patches of resistive material that are to be contacted to respective electrodes 302 of the decoupling capacitors 300. The second electronically conductive foil is processed to leave a patch of material that forms a resistor with a desired value. The patch provides an area on one end to accommodate electrical contact with the capacitor and is electrically isolated on the remaining three sides, except for intimate contact with the second foil. The positions of the formed resistors are such that the conductive end of each capacitor can complete an electrical path through the resistive element 400 to the supporting foils when the core is completed.

Figure 8:
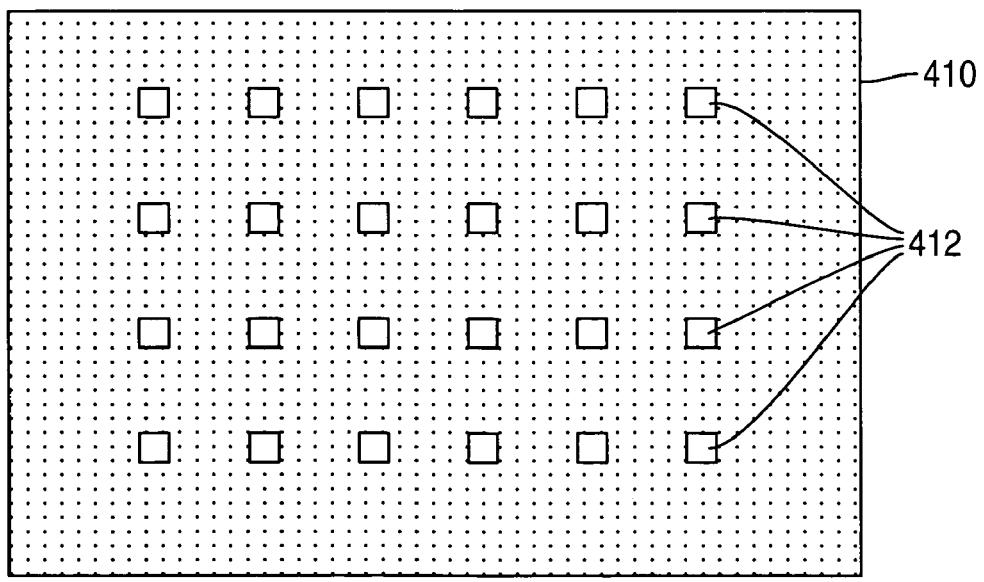
FIG. 8 is a top view of a template of dielectric material to provide decoupling capacitors and resistive elements in the circuit board of FIG. 7.

As shown in FIG. 8, a template 410 formed of the dielectric material for the core of FIG. 7 has openings 412 for the capacitors 300. After processing, the thickness of the dielectric layer 410 is very near the thickness of the capacitor 300. The template 410 is placed over the capacitors 300 and contacts the first conductive foil (layer 112). The second conductive foil (layer 108) is then placed resistive element 400 side down such that they are electrically contacted to capacitor electrodes to complete the current path.

Another example process of fabricating the core of FIG. 7 starts by placing the perforated dielectric template 410 onto the second conductive foil (layer 112) with the built-on resistive elements 400 such that the resistive elements appear in the holes 412 where the capacitors are then placed. Insulating material is deposited such that one electrode of every capacitor is isolated, while the other capacitors electrode is connected to the built-on resistive element 400 using conductive epoxy or another material. Then, the first conductive foil is (layer 108) is placed onto the assembly. The capacitor electrodes that are contacted to the resistive elements 400 are isolated from the second foil. The connections to the capacitor electrodes can be reinforced by micro-vias or other mechanisms. Micro-vias are very small vias of short length to electrically contact one electrical component to another electrical component. Due to their much shorter length, micro-vias have much smaller inductances than standard vias.

In another embodiment that is a modification of the FIG. 7 embodiment, a lossy resistive element is also provided between the capacitor electrode 304 and the lower reference plane layer 112. Alternatively, a resistive element can be provided between the electrode 304 and the reference plane layer 112 but not between the capacitor electrode 302 and the reference plane layer 108.

Figure 9:
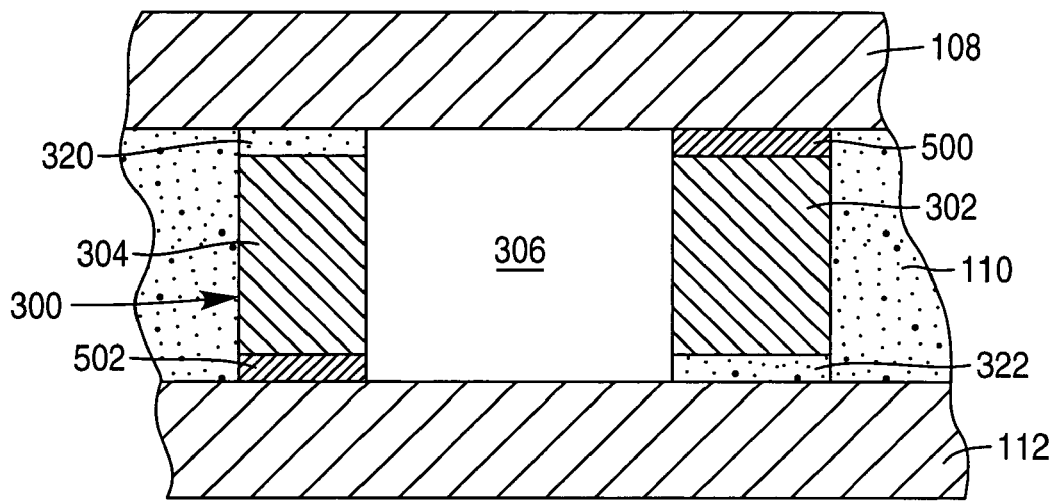
FIGS. 9 and 10 are cross-sectional side view of variations of the circuit board of FIG. 7.

According to yet another embodiment, no resistive material is used at all. This creates an embodiment in which embedded decoupling capacitors are provided between the reference plane layers 108 and 110 (without any resistive loss element or resistive layer). This arrangement is shown in FIG. 9, in which electrode 302 is electrically contacted to the reference plane layer 108 by an electrically conductive path 500 and the electrode 304 of the capacitor 300 is electrically contacted to the reference plane layer 112 by an electrically conductive path 502. In some cases, by placing the decoupling capacitor 300 on its side, the separation between the reference plane layers 108 and 112 can be reduced since the smallest dimension of the capacitor body determines the spacing between the reference plane layers.

In yet another embodiment, instead of providing the decoupling capacitor 300 and the resistive element 400 between reference plane layers 108 and 112, the decoupling capacitor 300 and resistive element can be provided on an outside surface 402 (FIG. 7) of the reference plane layer 108 or on an outside surface 404 (FIG. 7) of the reference plane layer 112.

Figure 10:
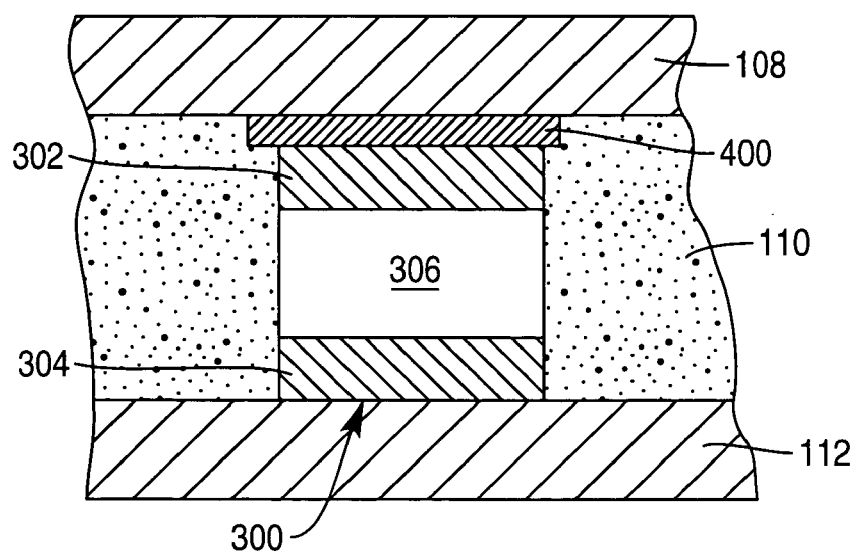

In yet another embodiment, shown in FIG. 10, the discrete capacitor 300 is placed vertically instead of on its side as shown in FIG. 7. In the FIG. 10 arrangement, the upper surface of the capacitor electrode 302 is electrically contacted to the resistive element 400, which is in turn electrically contacted to the upper reference plane layer 108. The lower electrode 304 of the discrete capacitor 300 is electrically contacted to the lower reference plane layer 112. In another arrangement, resistive loss elements can be provided both on the upper and lower ends of the discrete capacitor 300, or just on the lower side of the capacitor 300.

Figure 11:
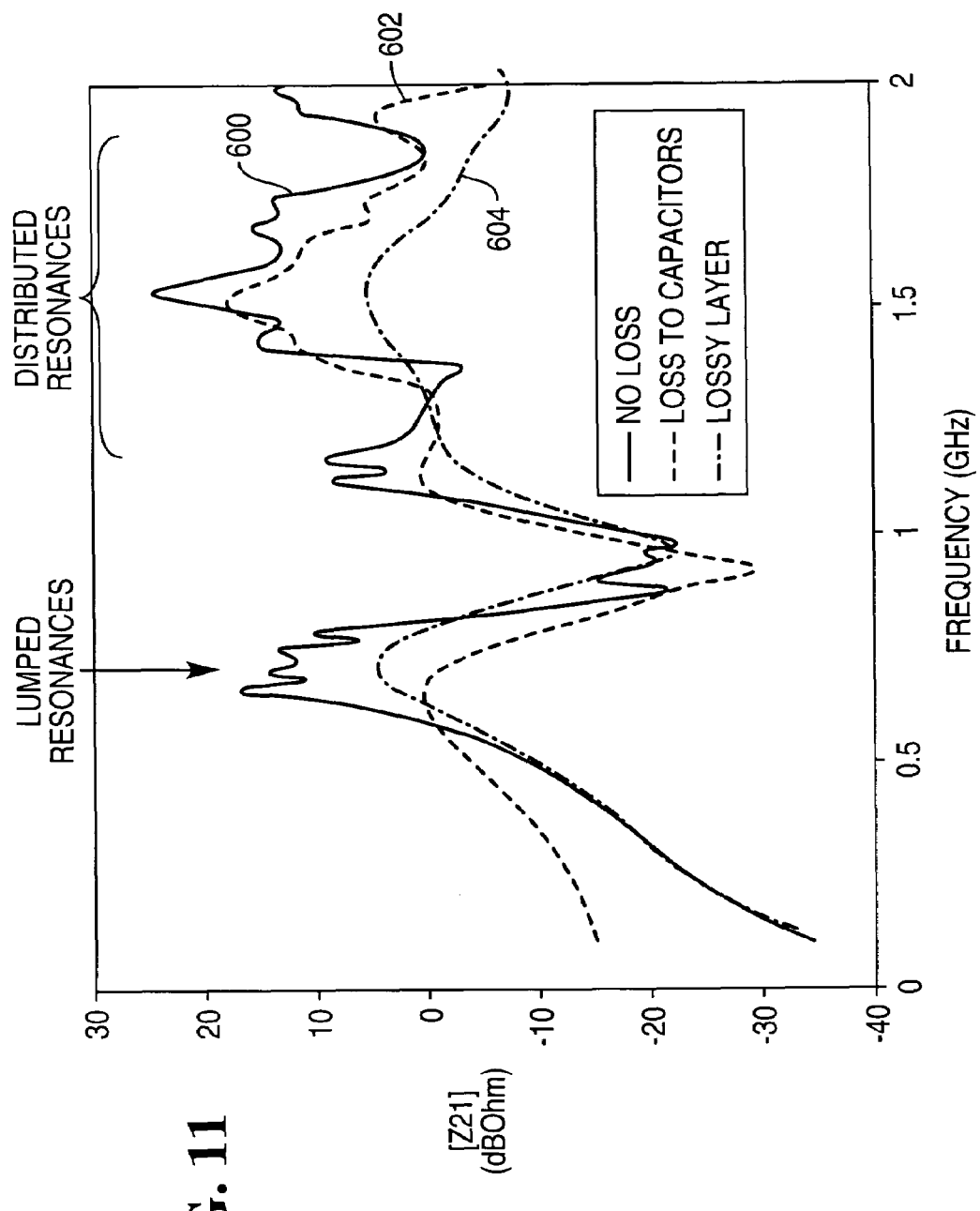
FIG. 11 illustrates graphs of lumped and distributed resonances in circuit boards of different arrangements.

A conceptual graphical view of the power bus impedance is shown in FIG. 11, which depicts three graphs 600, 602, and 604. The graph 600 depicts variation in the impedance of the power bus at the lumped resonances and distributed resonances where no lossy resistive element or resistive layer is employed. Curve 602 shows the reduction of variation in power bus impedance at the lumped resonances in the arrangement of FIG. 7, in which the resistive element 400 is coupled between the capacitor 300 and the reference plane layer 108. Curve 604 shows reduction in the variation of power bus impedance at the lumped resonances and distributed resonances by adding a resistive layer between the reference plane layers.

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A circuit board comprising:
a first reference plane layer;
a second reference plane layer;
a dielectric layer between the first and second reference plane layers;
a decoupling capacitor having first and second electrodes; and
a discrete resistor having first and second electrodes, the resistor's first electrode electrically connected to the first reference plane layer, the resistor's second electrode electrically connected to the decoupling capacitor's first electrodes, and the decoupling capacitor's second electrode electrically connected to the second reference plane layers.

2. A system comprising:
an integrated circuit device; and
a circuit board on which the integrated circuit device is mounted, the circuit board comprising:
a first reference plane layer;
a second reference plane layer,
a dielectric layer between the first and second reference plane layers;
a decoupling capacitor having first and second electrodes; and
a discrete resistor having first and second electrodes, the discrete resistor's first electrode electrically connected to the first reference layer, the discrete resistor's second electrode electrically connected to the decoupling capacitor's first electrode, and the decoupling capacitor's second electrode electrically connected to the second reference layer.

* * * * *